United States Patent
Kim et al.

(10) Patent No.: US 9,437,274 B1
(45) Date of Patent: Sep. 6, 2016

(54) MEMORY DEVICE

(71) Applicant: SK hynix Inc., Gyeonggi-do (KR)

(72) Inventors: Kwi-Dong Kim, Gyeonggi-do (KR); Jun-Hyun Chun, Gyeonggi-do (KR)

(73) Assignee: SK Hynix Inc., Gyeonggi-do (KR)

( * ) Notice: Subject to any disclaimer, the term of this patent is extended or adjusted under 35 U.S.C. 154(b) by 0 days.

(21) Appl. No.: 15/006,995

(22) Filed: Jan. 26, 2016

(30) Foreign Application Priority Data

Aug. 6, 2015 (KR) .................. 10-2015-0111080

(51) Int. Cl.
*G11C 7/00* (2006.01)
*G11C 11/00* (2006.01)
*G11C 11/406* (2006.01)

(52) U.S. Cl.
CPC .................................. *G11C 11/406* (2013.01)

(58) Field of Classification Search
CPC ....... G11C 7/04; G11C 7/222; G11C 11/401; G11C 11/406; G11C 11/40626; G11C 11/4096; G11C 11/40615; G11C 29/023; G11C 11/4076; G11C 2211/4067; G11C 2029/4402; G11C 5/063; G11C 5/147; G11C 5/14
See application file for complete search history.

(56) References Cited

U.S. PATENT DOCUMENTS

| 8,630,141 B2 | 1/2014 | Tamlyn | |
|---|---|---|---|
| 2013/0028034 A1* | 1/2013 | Fujisawa | G11C 11/40615 365/194 |
| 2014/0192583 A1* | 7/2014 | Rajan | G11C 7/10 365/63 |
| 2014/0289574 A1* | 9/2014 | Tsern | G11C 29/50016 714/718 |

FOREIGN PATENT DOCUMENTS

KR 1020150017276 2/2015

\* cited by examiner

*Primary Examiner* — Hien Nguyen
(74) *Attorney, Agent, or Firm* — IP & T Group LLP

(57) ABSTRACT

A memory device may include a plurality of word lines each word line being operably coupled to one or more memory cells; a peripheral circuit suitable for performing first and second refresh operations to the plurality of word lines; wherein the first refresh operation is suitable for preserving stored data for a majority of the memory cells of the memory device and the second refresh operation is suitable for preserving stored data of one or more weak memory cells.

25 Claims, 17 Drawing Sheets

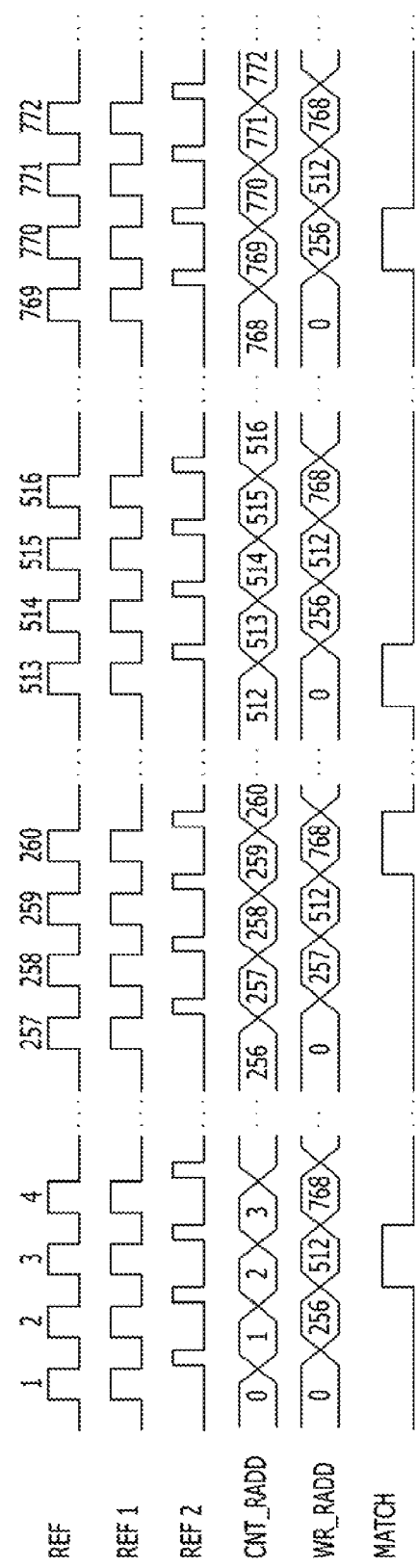

MEMORY DEVICE

CROSS-REFERENCE TO RELATED APPLICATION(S)

The present application claims priority of Korean Patent Application No. 10-2015-0111080, filed on Aug. 6, 2015, which is incorporated herein by reference in its entirety.

BACKGROUND

1. Field

Exemplary embodiments of the present invention relate generally to memory devices and more particularly to a memory device and method of operation thereof providing improved stored data retention.

2. Description of the Related Art

A memory cell of a semiconductor memory device (also referred to hereinafter simply as a memory device) may include a transistor functioning as a gate or switch for controlling the flow of one or more charges to and from the memory cell and a capacitor for storing one or more charges, each charge representing one bit of information i.e., data. Data in each memory cell may be high logic 1, or low logic 0 depending on whether a charge stored in the capacitor is high or low voltage.

Generally, retention of stored data may cause no consumption of power. However, it has been observed that stored data may be lost because stored charges may change or degrade overtime due to a leakage current which may be attributable to the PN junction of a transistor such as an NMOS transistor. To prevent stored data loss, before data is lost, data is read and the normal stored charges are recharged based on the read data. Hence typically, data may be retained only when such a recharging operation, also known as a refresh operation, is periodically repeated.

A refresh operation may typically be performed whenever a refresh command is inputted from a memory controller to the memory. The memory controller may input a refresh command to the memory periodically at a specific time interval taking into account the data retention time of the memory into consideration. For example, it is not uncommon for a memory controller to input 8000 refresh commands to a memory device for refreshing all memory cells during a period of 64 ms based on a typical data retention time of a memory device.

When a memory device includes one or more weak memory cells having a retention time that is smaller than the retention time of the majority of the memory cells of the memory device, an error may occur in the memory device.

SUMMARY

Various embodiments of the invention are directed to a memory device which may perform at least one additional refresh operation for one or more weak memory cells having an Insufficient data retention time, i.e. a data retention time that is smaller than the time interval of a first refresh operation. According to the invention weak memory cells may also retain their stored and therefore operate normally.

In an embodiment, a memory device may include a plurality of word lines each word line being operably coupled to one or more memory cells; a peripheral circuit suitable for performing first and second refresh operations to the plurality of word lines; wherein the first refresh operation is suitable for preserving stored data for a majority of the memory cells of the memory device and the second refresh operation is suitable for preserving stored data of one or more weak memory cells.

In an embodiment, a memory device may include a plurality of word lines coupled to one or more memory cells; a peripheral circuit suitable for performing first and second refresh operations to the plurality of word lines; a nonvolatile memory unit suitable for storing weak row addresses of one or more weak word lines among the plurality of word lines; and a refresh control unit suitable for controlling the peripheral circuit to perform the first refresh operation to the plurality of word lines once during a refresh section divided into N numbers (N is a natural number more than two) of sub-refresh sections, and to perform the second refresh operation to the weak word lines during the refresh section, wherein the refresh control unit controls the peripheral circuit to perform the first and second refresh operations to each of the weak word lines at an interval of one or more of the N numbers of sub-refresh sections.

In an embodiment, a memory device may include first to N-th word lines coupled to one or more memory cells; a peripheral circuit suitable for performing first and second refresh operations to the plurality of word lines; a nonvolatile memory unit comprising first to N-th nonvolatile memory cells suitable for storing first to N-th weak data, which correspond to the respective first to N-th word lines and each of which stores one of first and second values; and a refresh control unit suitable for controlling the peripheral circuit to sequentially perform the first refresh operation to the plurality of word lines during a refresh section, and to perform the second refresh operation to weak word lines during the refresh section based on the first to N-th weak data.

BRIEF DESCRIPTION OF THE DRAWINGS

FIGS. 8A and 8B are diagrams illustrating an example operation of the memory device, according to an embodiment of the invention.

DETAILED DESCRIPTION

Figure 1:
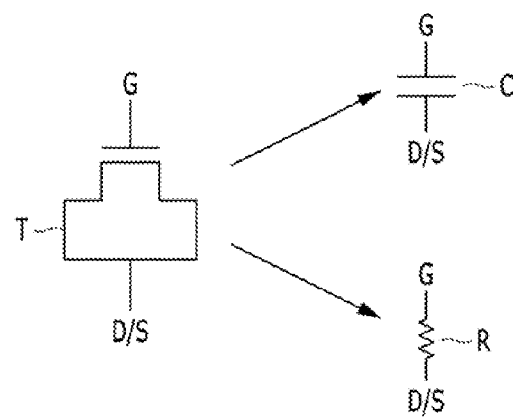
FIG. 1 is a diagram illustrating an e-fuse formed of a transistor and an equivalent circuit of a resistor or a capacitor corresponding to the e-fuse, according to an embodiment of the invention.

Various embodiments will be described below with reference to the accompanying drawings. The present invention may, however, be embodied in different forms and should not be construed as limited to the embodiments set forth herein. Rather, these embodiments are provided so that this disclosure will be thorough and complete. Throughout the disclosure, like reference numerals refer to like parts throughout the various figures and embodiments of the present invention.

Hereinafter, a first refresh operation may refer to a refresh operation performed to most or all word lines so that most or all word lines included in a cell array (or memory bank) may be sequentially refreshed once during a refresh section tRFC. A second refresh operation may refer to an additional refresh operation additionally performed to a weak word line in addition to a first refresh operation so that the weak word line having a weak memory cell may also retain stored data. A weak memory cell may be a cell having a substantially lower retention time than the majority of the memory cells. A weak memory cell may also be refereed to hereinafter as having an insufficient retention time in relation to the period of iterations of a first refresh operation designed to preserve the stored data for most of the memory cells. An address of a weak word line may also be referred to hereinafter as a weak row address.

Referring now to FIG. 1 an e-fuse including a transistor T and an equivalent circuit of a resistor or a capacitor corresponding to the e-fuse are provided, according to an embodiment of the invention. A power supply voltage may be applied to a gate G of the transistor T, and a ground voltage may be applied to a drain or source D/S of the transistor T.

The e-fuse may operate as a capacitor C by applying a power supply voltage to the gate G that is tolerable by the transistor T. Accordingly, there is no current flowing between the gate G and the drain/source D/S. Applying a high power supply voltage to the Gate G, that is intolerable by the transistor T, the gate oxide layer of the transistor T may be broken, the gate G and the drain/source D/S shorted, and thus the e-fuse may operate as a resistor R. Accordingly, an electric current may flow between the gate G and the drain/source D/S in which case the transistor may act as a resistance. Data of the e-fuse may be recognized through a resistance value between the gate G and drain/source D/S of the e-fuse using such a phenomenon.

Figure 2:
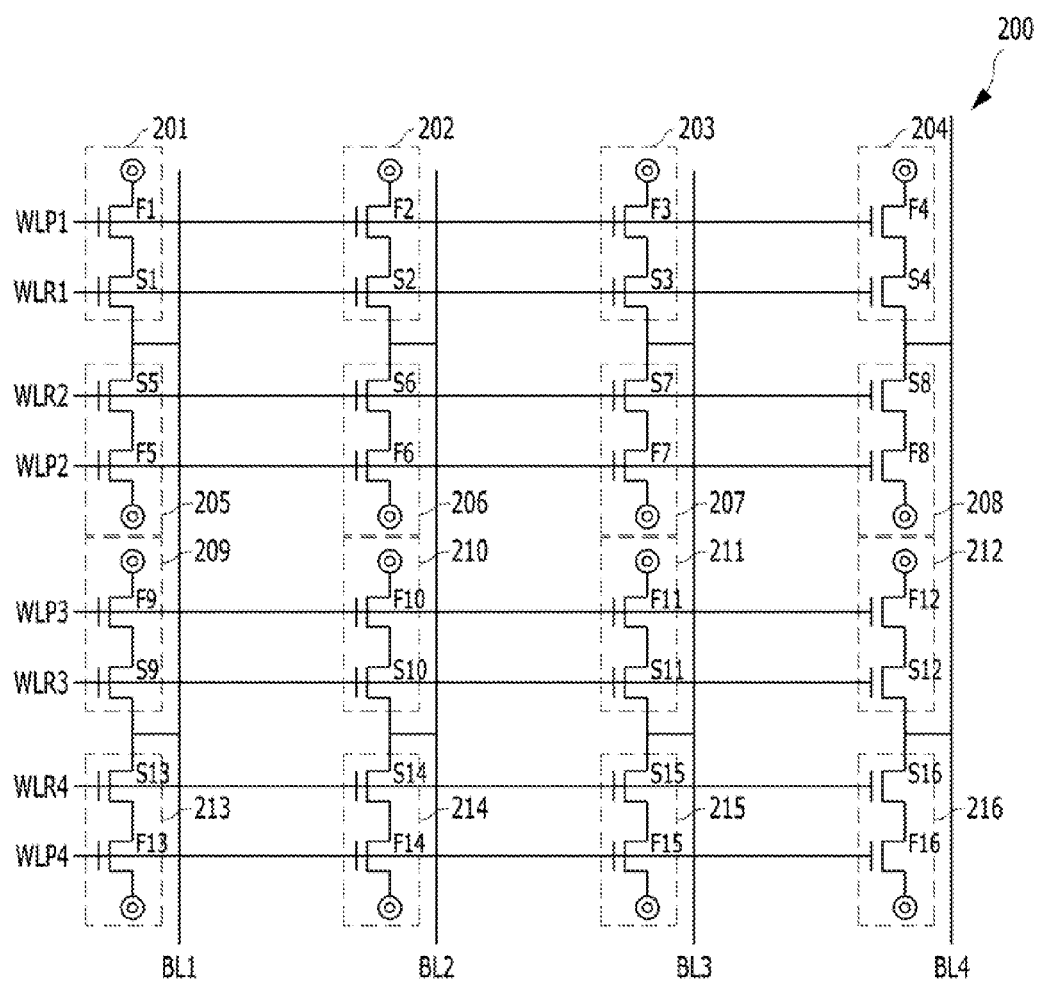
FIG. 2 is a diagram of a fuse cell array including an e-fuse, according to an embodiment of the invention.

FIG. 2 is a simplified diagram of a fuse cell array 200 including a plurality of e-fuse cells. The fuse cell array 200 may include fuse cells 201 to 216 arranged in a plurality of rows and columns. Each of the fuse cells 201 to 216 may include a fuse transistor F1 to F16 and a select transistor S1 to S16. Each of the fuse transistors F1 to F16 may be an e-fuse having the property of a resistor or a capacitor depending on the rupture or not of the fuse transistor. Each of the e-fuses F1 to F16 may be a resistive fuse transistor which stores data depending on the size of a resistor thereof. The select transistors S1 to S16 may electrically couple the fuse transistors F1 to F16 and the column lines BL1 to BL4 depending on control of row lines WLR1 to WLR4. A proper voltage may be applied to program/read lines WLP1 to WLP4 depending on an operation to the fuse cell array 200.

During a program operation, a selected row line WLR1 to WLR4 may be activated, a corresponding select transistor S1 to S16 turned on, and a high voltage may be applied to a corresponding program/read line WLP1 to WLP4. A low or high level voltage may be applied to a selected column line. If a high voltage is applied, selected fuses may be programmed (i.e., ruptured), while if a low voltage is applied selected fuses are not programmed.

During a read operation, a selected row line may be activated, corresponding select transistors turned on, and a voltage suitable for the read operation may be applied to a selected program/read line. A low level voltage may be applied to a selected column line. When an electric current flows through the selected column line, a corresponding fuse may be recognized as programmed. When an electric current does not flow through the selected column line, a corresponding fuse may be recognized as not programmed.

The number of rows, columns, and fuse cells of the fuse cell array 200 may differ.

Figure 3:
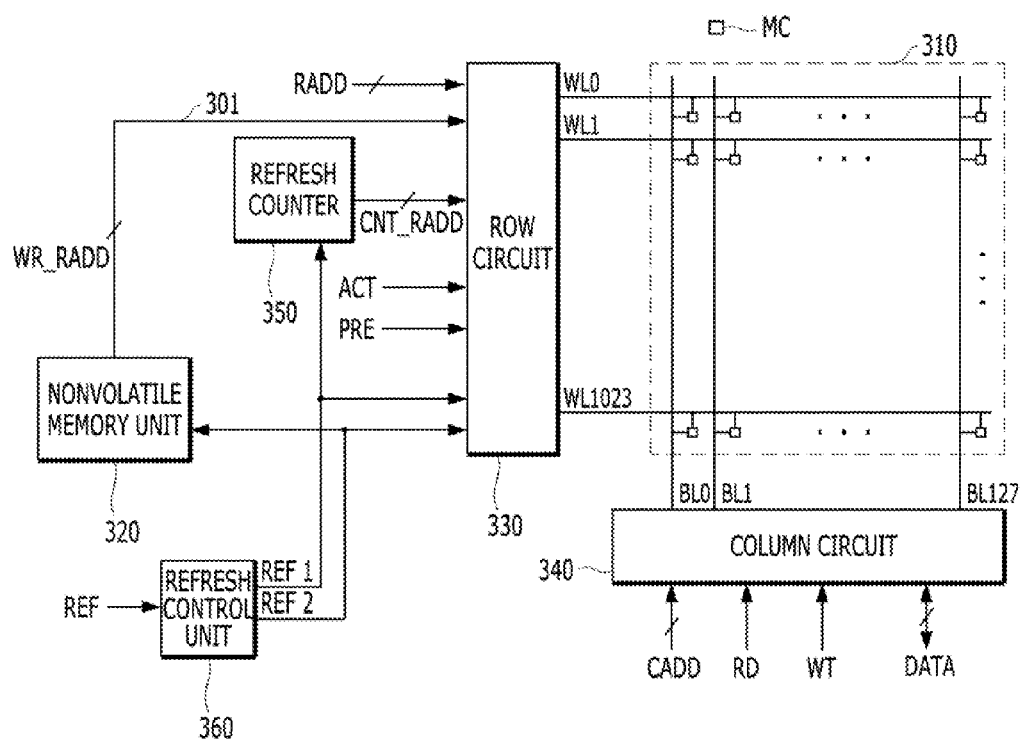
FIG. 3 is a diagram of a memory device, according to an embodiment of the invention.

FIG. 3 illustrates a memory device according to an embodiment of the present invention. The memory device may include a cell array 310, a nonvolatile memory unit 320, a row circuit 330, a column circuit 340, a refresh counter 350, and a refresh control unit 360.

The nonvolatile memory unit 320 may store the weak row addresses WR_RADD of the cell array 310. The nonvolatile memory unit 320 may be any suitable nonvolatile memory, such as, for example, an e-fuse array circuit, a NAND flash memory, a NOR flash memory, a magnetic random access memory (MRAM), a spin transfer magnetic random access memory (STT-MRAM), a resistive random access memory (ReRAM), a phase change random access memory (PC RAM) and the like.

In an embodiment, a second refresh signal REF2 may be enabled, and the nonvolatile memory unit 320 may sequentially provide the weak row addresses WR_RADD to the row circuit 330 through a transmission bus 301.

The row circuit 330 may control operations for activating and precharging selected word lines in response to row addresses RADD, CNT_RADD, and WR_RADD. An active signal ACT may be enabled in response to an active command, causing the row circuit 330 to activate a word line WL0 to WL1023 corresponding to a row address RADD. A precharge signal PRE may be enabled in response to a precharge command, causing the row circuit 330 to precharge the activated word line. Furthermore, a first refresh signal REF1 may be enabled causing the row circuit 330 to perform a refresh operation (i.e., an active operation and a precharge operation) to one or more word lines WL0 to WL1023 corresponding to the counting address CNT_RADD. By enabling a second refresh signal REF2, the row circuit 330 may perform a refresh operation to a weak word line corresponding to a weak row address WR_RADD. During the refresh operation, an active operation and a precharge operation may be performed to a selected word line of the plurality of word lines WL0 to WL1023, and the data of memory cells MC coupled to the selected word line may be refreshed.

The column circuit 340 may access (i.e., read or write) the data DATA of a bit line BL0 to BL127 selected by a row address CADD. The cell array 310 may include a plurality of word lines WL0 to WL1023, a plurality of bit lines BL0 to BL127, and a plurality of memory cells MC coupled between corresponding word lines and corresponding bit lines. A read signal RD may be enabled in response to a read command. A write signal WT may be enabled in response to a write command.

The refresh counter 350 may generate the counting address CNT_ADD by performing counting whenever the first refresh signal REF1 is enabled. The refresh counter 350 may increase the value of the counting address CNT_ADD by 1 whenever the first refresh signal REF1 is enabled so that a (K+1)-th word line is selected next time when a K-th word line is currently selected.

The refresh control unit 360 may enable the first refresh signal REF1 when a refresh signal REF is enabled and may enable the second refresh signal REF2 when the refresh signal REF is enabled a specific number of times.

For reference, the number of word lines, bit lines, and memory cells included in the cell array 310 may differ.

Figure 4:
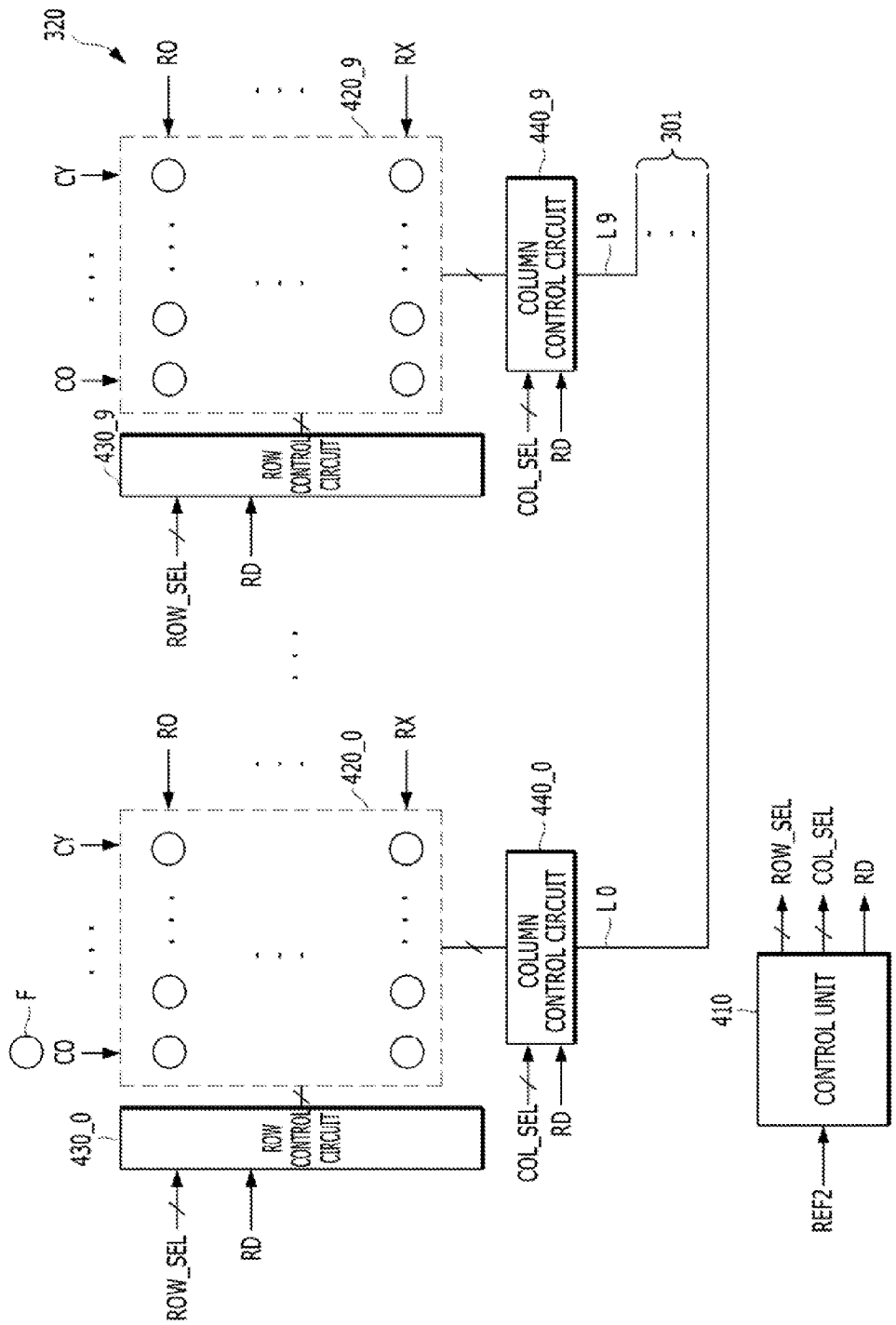
FIG. 4 is a diagram of a nonvolatile memory unit 320 of FIG. 3, according to an embodiment of the invention.

Referring now to FIG. 4, an example of a nonvolatile memory unit 320 is provided that may include a control unit 410, a plurality of cell arrays 420_0 to 420_9, a plurality of row control circuits 430_0 to 430_9, and a plurality of column control circuits 440_0 to 440_9.

The control unit 410 may generate a read signal RD, row selection information ROW_SEL, and column selection information COL_SEL. The control unit 410 may enable the read signal RD when the second refresh signal REF2 is enabled. The control unit 410 may generate the row selection information ROW_SEL and the column selection information COL_SEL so that nonvolatile memory cells selected in the respective cell arrays 420_0 to 420_9 may be changed when the second refresh signal REF2 is enabled.

The plurality of cell arrays 420_0 to 420_9 may include a plurality of nonvolatile memory cells disposed in a plurality of rows R0 to RX and columns C0 to CY. The nonvolatile memory unit 320 may be an e-fuse array circuit comprising a plurality of nonvolatile memory cells formed of e-fuses, for example such as the ones shown in FIG. 1. Each of the plurality of cell arrays 420_0 to 420_9 may be a fuse cell array 200 as shown in FIG. 2.

When a read signal RD is enabled, each of the row control units 430_0 to 430_9 may select a row R0 to RX in each cell array 420_0 to 420_9 corresponding to the row selection information ROW_SEL. By enabling a read signal RD, each the column control units 440_0 to 440_9 may select a column C0 to CY in each cell array 420_0 to 420_9 corresponding to the column selection information COL_SEL. The column control units 440_0 to 440_9 may read the data of nonvolatile memory cells coupled to the selected rows and columns and provide the read data to respective transmission lines L0 to L9. The transmission lines L0 to L9 may form the transmission bus 301.

For example, a weak row address WR_RADD may be a digital signal of 10 bits stored in cell arrays 420_0 to 420_9, respectively.

The number of rows, columns, and memory cells included in each of the cell arrays 420_0 to 420_9 may differ. The number of cell arrays included in a nonvolatile memory unit may also differ.

Figure 5A:
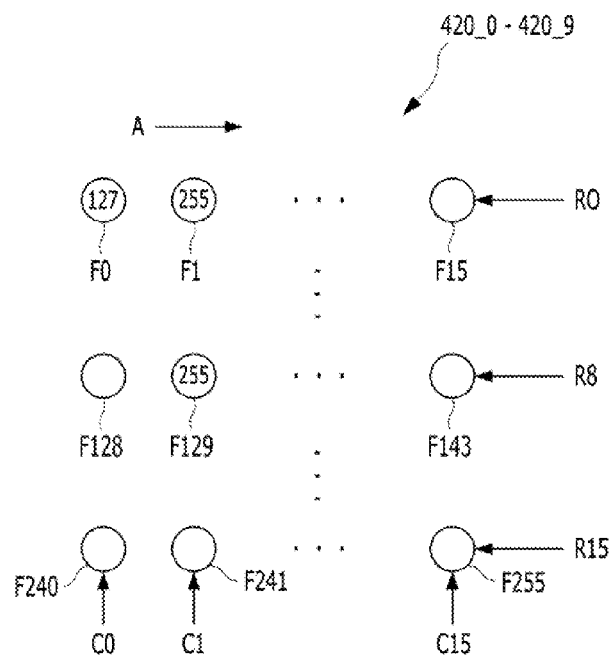
FIGS. 5A and 5B are diagrams illustrating an example operation of a memory device, according to an embodiment of the Invention.
Figure 5B:
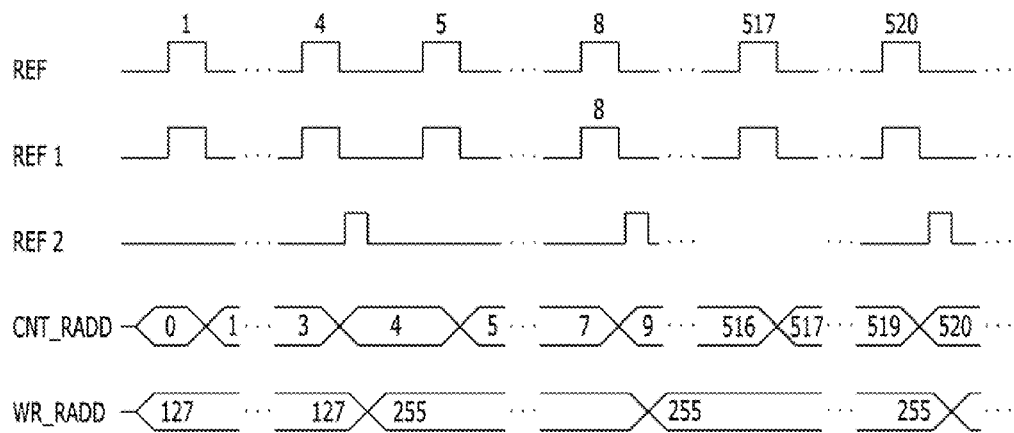

FIGS. 5A and 5B are diagrams illustrating an example operation of a memory device according to an embodiment of the invention. Accordingly, a memory device may perform a second refresh operation to a weak word line during a refresh section tRFC one or more times corresponding to the number of the weak row addresses WR_RADD stored in the nonvolatile memory unit 320. For example, in an embodiment, if a single weak row address is stored in the nonvolatile memory unit 320 then the memory device may perform a second refresh operation once to the weak word line. If a plurality of weak row addresses WR_RADD are stored in the nonvolatile memory device then the memory device may perform a plurality of second refresh operations one for each weak word line address. In an embodiment, the nonvolatile memory unit 320 may store a single or multiple instances of a particular weak row address WR_RADD according to the number of times that a second refresh operation may be required to be performed to each particular weak word line corresponding to a particular weak row address WR_RADD.

Hereinafter, an example of a refresh operation of the memory device is described with a second refresh signal REF2 being enabled once when the refresh signal REF is enabled four times. Each of the cell arrays 420_0 to 420_9 may include 16 rows and columns.

Referring to the example of FIG. 5A, a weak row address 127 corresponding to a word line WL127 has been once stored in a nonvolatile memory cell F0 in each of the cell arrays 420_0 to 420_9, and a weak row address 255 corresponding to the word line WL255 has been stored in nonvolatile memory cells F1 and F129 in each of the cell arrays 420_0 to 420_9.

Only one cell array has been illustrated in FIG. 5A for convenience because the bits of the weak row address WR_RADD are respectively stored in the same locations in the cell arrays 420_0 to 420_9. When the second refresh signal REF2 is enabled, the control unit 410 may control peripheral circuits to select one nonvolatile memory cell of the same location in each of the cell arrays 420_0 to 420_9. As the second refresh signal REF2 may be enabled multiple times, the control unit 410 may control the peripheral circuit to select the nonvolatile memory cells F0 to F255 in a preset sequential order. For example, in the example of FIG. 5A an arrow A in each row denotes a preset sequential order.

Referring to FIG. 5B, the first refresh signal REF1 may be enabled, causing a first refresh to be performed to a word line corresponding to the counting address CNT_RADD. The counting address CNT_RADD is increased from 0 to 1023 by a step of 1 each time in response to a first refresh signal REF1. Hence, for example, when the first refresh signal REF1 is enabled 1024 times (i.e., the refresh command REF is provided 1024 times), all the word lines WL0 to WL1024 are refreshed once. However, as illustrated in the example of FIG. 5B, the second refresh signal REF2 may be enabled once when the refresh signal REF is enabled four times. Hence, only one additional refresh operation may be performed for a weak word line for every four normal refresh operations.

For example, when the fourth refresh command REF is provided, the word line WL3 may be subject to the first refresh operation because the counting address CNT_RADD is 3, and the weak row word line WL127 may be subject to the second refresh operation because the weak row address WR_RADD is 127 stored in the nonvolatile memory cell F0. When an eighth refresh command REF is provided, the word line WL7 is subject to the first refresh operation because the counting address CNT_RADD is 7, and the weak row word line WR255 is subject to the second refresh operation because the weak row address WR_RADD is 255 stored in the nonvolatile memory cell F1. When a (520)-th refresh command REF is provided, the word line WL519 is subject to the first refresh operation because the counting address CNT_RADD is 519, and the weak row word line WL255 is subject to the second refresh operation because the weak row address WR_RADD is 255 stored in the nonvolatile memory cell F129.

The memory device described with reference to FIGS. 5A and 5B may prevent degradation of a weak word line data by storing the corresponding weak row address WR_RADD in the nonvolatile memory unit 320 and performing a second refresh operation on the weak word line using the stored weak row address WR_RADD. It is noted that the memory device, in an embodiment, may prevent degradation of a weak word line data that requires two or more second refresh operations during a refresh section tRFC. For example, the memory device may store a single number or a plural number of a particular weak row address WR_RADD according to a number of times that the second refresh operation may be required to be performed to a particular weak word line corresponding to a particular weak row address WR_RADD.

Figure 6A:
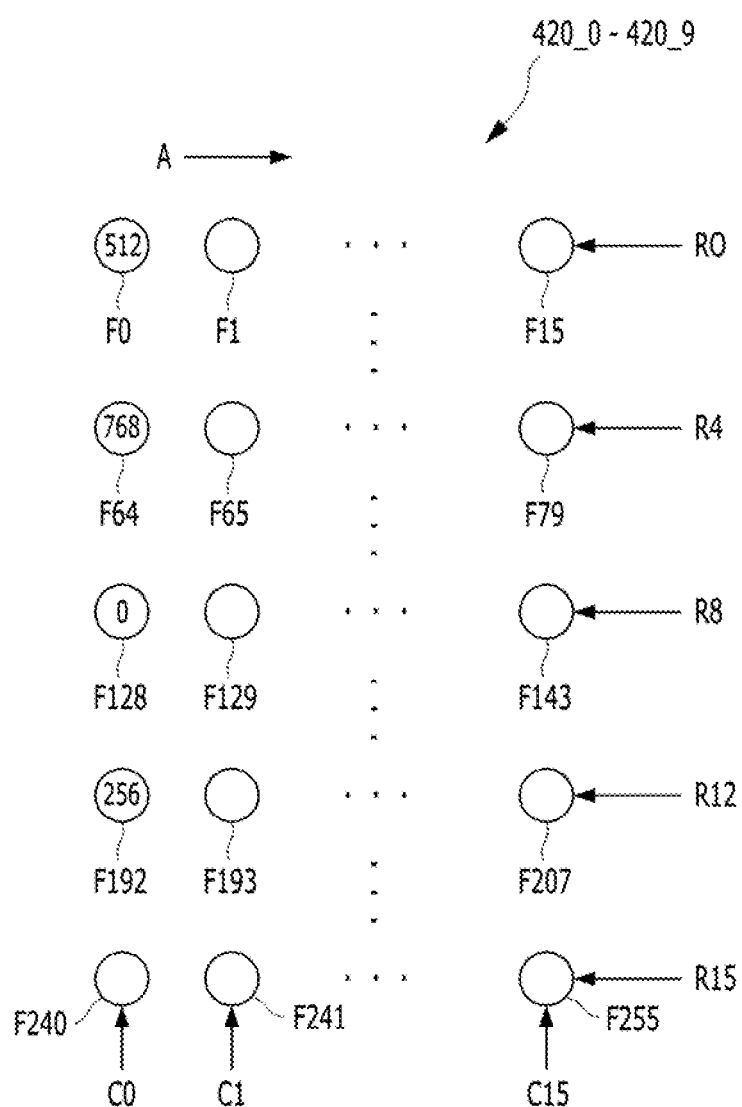
FIGS. 6A and 6B are diagrams illustrating an example operation of a memory device, according to an embodiment of the invention.
Figure 6B:
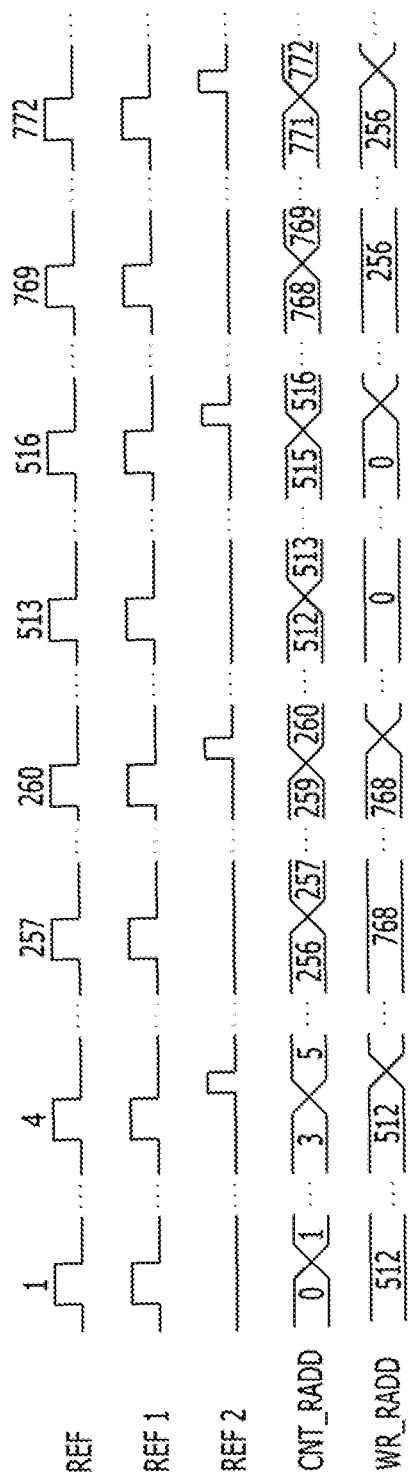

FIGS. 6A and 6B are diagrams illustrating an example operation of the memory device according to an embodiment of the invention.

The memory device described with reference to FIGS. 6A and 6B may perform a first and a second refresh operation to a weak word line at a proper time interval in a refresh section tRFC. Hereinafter, the refresh section tRFC may be divided into first to fourth sections in which the first or second refresh operation is performed to the word lines WL0 to WL255, WL256 to WL511, WL512 to WL767, and WL768 to WL1023, respectively.

For a weak word line to retain its data, the first refresh and second refresh operations to a weak word line should be performed at a proper interval in a refresh section. The interval between the first and second refresh operations for a weak row word line may differ. For example, a very short period may be needed when the word line WL0 is the weak word line and the word line WL0 is subject to the second refresh operation in response to a second refresh command REF. Since the first refresh operation is performed to the word line WL0 in response to a first refresh command REF, the data of the weak row word line WL0 needs to be retained for almost the refresh section tRFC. In other words, the data of the weak row word line WL0 needs to be retained from the second refresh command REF in the current refresh section tRFC to the first refresh command REF in the next refresh section tRFC. In a case wherein the word line WL0 is subject to the second refresh operation in response to a (1024)-th refresh command REF, the data of the weak row word line WL0 needs to be retained from the first refresh command REF to the (1024)-th refresh command REF in the refresh section tRFC.

For example, the interval between the first and second refresh operations to a weak word line may be one half (½) of the refresh section tRFC. For example, when the word line WL0 is the weak word line, it may be advantageous to retain the data of the weak memory cells coupled to the weak word line when the weak word line is subject to the second refresh operation in response to a (513)-th refresh command REF.

FIGS. 6A and 6B illustrate one of the cell arrays 420_0 to 420_9 divided into four regions corresponding to first to fourth sections of a refresh section tRFC in which a first or second refresh operations are performed to the word lines WL0 to WL255, WL256 to WL511, WL512 to WL767, and WL768 to WL1023, respectively. The memory device may perform the first and second refresh operations to the weak word line at a proper interval therebetween.

Hereinafter, a refresh operation of a memory device is described below with an example wherein a second refresh signal REF2 is enabled once whenever the refresh signal REF is enabled four times. Each of the cell arrays 420_0 to 420_9 may include 16 rows and columns.

Referring to FIG. 6A, the cell arrays 420_0 to 420_9 may be divided into first to fourth regions respectively including nonvolatile memory cells F0 to F63, F64 to F127, F128 to F191, and F192 to F255.

For example, he interval between the first and second refresh operations to the weak word line may be set at one half (½) of the refresh section tRFC. To this end, the weak row addresses falling in the range of WL0 to WL255 corresponding to the first section of the refresh section tRFC for the first refresh operation may be stored in the third region of each cell array 420_0 to 420_9; the weak row addresses falling in the range of WL256 to WL511 corresponding to the second section of the refresh section tRFC for the first refresh operation may be stored in the fourth region of each cell array 420_0 to 420_9; the weak row addresses falling in the range of WL512 to WL767 corresponding to the third section of the refresh section tRFC for the first refresh operation may be stored in the first region of each cell array 420_0 to 420_9; and the weak row addresses falling in the range of WL768 to WL1023 corresponding to the fourth section of the refresh section tRFC for the first refresh operation may be stored in the second region of each cell array 420_0 to 420_9.

In this embodiment, the word lines WL0, WL256, WL512, and WL768 are weak word lines. The address 0 of the weak row word line WL0 subject to the first refresh operation in the first section of the refresh section tRFC may be stored in the nonvolatile memory cell F128 of the third region, the address 256 of the weak row word line WL256 subject to the first refresh operation in the second section of the refresh section tRFC may be stored in the nonvolatile memory cell F192 of the fourth region, the address 512 of the weak row word line WL512 subject to the first refresh operation in the third section of the refresh section tRFC may be stored in the nonvolatile memory cell F0 of the first region, and the address 768 of the weak row word line WL768 subject to the first refresh operation in the fourth section of the refresh section tRFC may be stored in the nonvolatile memory cell F64 of the second region. As the second refresh signal REF2 may be enabled plural times, the control unit 410 may control the peripheral circuit to select the nonvolatile memory cells F0 to F255 in a preset sequential order. FIG. 6A shows an arrow direction A in each row as the preset sequential order.

Referring to FIG. 6B, a fourth refresh command REF is provided, the word line WL3 is subject to the first refresh operation because the counting address CNT_RADD is 3, and the weak row word line WL512 is subject to the second refresh operation because the weak row address WR_RADD is 512 stored in the nonvolatile memory cell F0. When a (260)-th refresh command REF is provided, the word line WL259 is subject to the first refresh operation because the counting address CNT_RADD is 259, and the weak row word line WL768 is subject to the second refresh operation because the weak row address WR_RADD is 768 stored in the nonvolatile memory cell F64. When a (516)-th refresh command REF is provided, the word line WL515 is subject to the first refresh operation because the counting address CNT_RADD is 515, and the weak row word line WL0 is subject to the second refresh operation because the weak row address WR_RADD is 0 stored in the nonvolatile memory cell F128. When a (772)-th refresh command REF is provided, the word line WL771 is subject to the first refresh operation because the counting address CNT_RADD is 771, and the weak row word line WL256 is subject to the second refresh operation because the weak row address WR_RADD is 256 stored in the nonvolatile memory cell F192.

Figure 7:
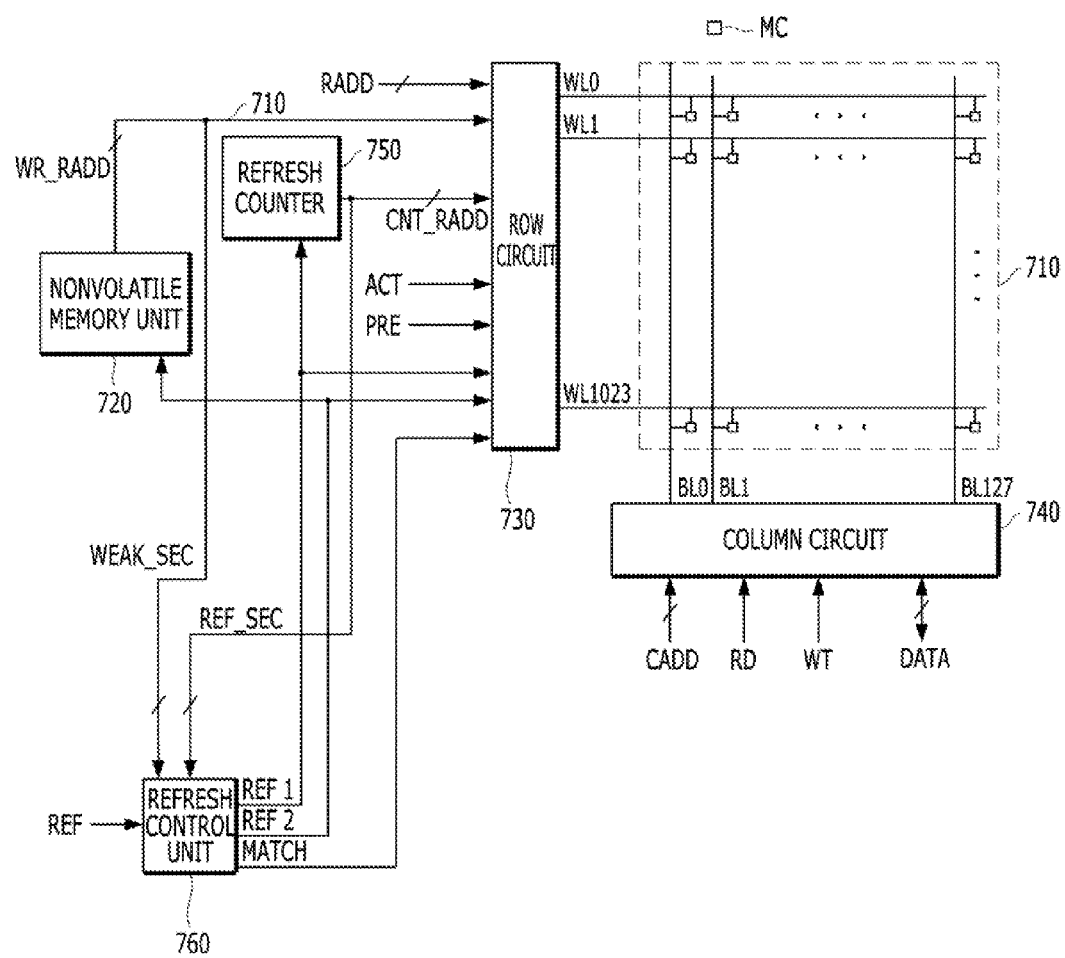
FIG. 7 is a diagram of a memory device, according to an embodiment of the invention.

Referring to FIG. 7, another embodiment of a memory device is provided, which may include a cell array 710, a nonvolatile memory unit 720, a row circuit 730, a column circuit 740, a refresh counter 750, and a refresh control unit 760. The cell array 710, the row circuit 730, the column circuit 740, and the refresh counter 750 may be the same as the cell array 310, the row circuit 330, the column circuit 340, and the refresh counter 350 described with reference to FIG. 3. The memory device of FIG. 7 may properly set the interval between the first and second refresh operations to a weak row word line through control of the refresh control unit 760. The data of the nonvolatile memory unit 720 may be transmitted through a transmission bus 701.

Figure 8A:
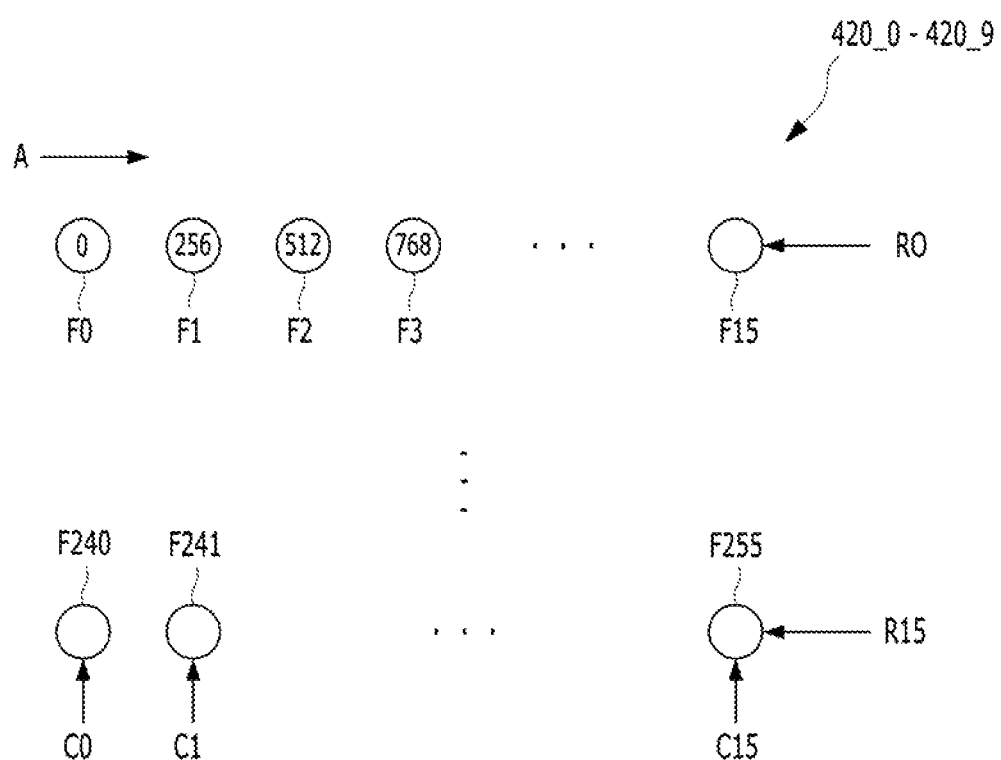

FIGS. 8A and 8B illustrate a memory device configured to compare a specific bit of a weak row address WR_RADD with a specific bit of a counting address CNT_RADD, and perform a second refresh operation based on a result of the comparison so that the first and second refresh operations are performed to the weak row word line at a proper interval to ensure protection of the data stored in the weak word line.

Hereinafter, the refresh operation of the memory device is described with an example wherein a second refresh signal REF2 is enabled each time the refresh signal REF is enabled. Also, the refresh section tRFC may be divided into first to fourth sections in which the first or second refresh operation is performed to the word lines WL0 to WL255, WL256 to WL511, WL512 to WL767, and WL768 to WL1023, respectively.

Referring to the example of FIG. 8A, it is assumed that weak word lines are the word lines WL0, WL256, WL512, and WL768 and corresponding weak row addresses are stored in the nonvolatile memory cell F0 to F3, respectively. As the second refresh signal REF2 is enabled multiple times, the control unit 410 may control the peripheral circuit to select the nonvolatile memory cells F0 to F255 in a preset sequential order as indicated by arrow A. For example, the binary values of 0, 256, 512, and 768 are 0000000000, 0100000000, 1000000000, and 11000000000, respectively.

Upper 2 bits (referred to as "weak word line region information") of a weak row address WR_RADD represent one of the first to fourth sections of the refresh section tRFC in which a weak word line corresponding to a weak row address WR_RADD is subject to the first refresh operation, and upper 2 bits (referred to as "reference section information") of the counting address CNT_RADD represent one of the first to fourth section of the refresh section tRFC in which the word line corresponding to the counting address CNT_RADD is currently subject to the first refresh operation. Upper 2 bits having the value of 00, 01, 10, and 11 of each of the counting address CNT_RADD and the weak word line region information may correspond to the first to fourth sections of the refresh section tRFC, respectively.

For example, the interval between the first and second refresh operations to the weak word line may be one half (½) of the refresh section tRFC. To this end, when the reference section information REF_SEC of the current counting address CNT_RADD represents 00, 01, 10, and 11, the refresh control unit 760 may control the peripheral circuits to perform the second refresh operation to the weak row addresses WD_RADD having weak word line region information WEAK_SEC of 10, 11, 00, and 01, respectively. Further, the refresh control unit 760 may generate a matching signal MATCH enabled to perform the second refresh operation when the reference section information REF_SEC and the weak word line region information WEAK_SEC have the preset combination as described above. The matching signal MATCH may be enabled when the reference section information REF_SEC and the weak word line region information WEAK_SEC have one of the combination: (00, 10), (01, 11), (10, 00), and (11, 01). The row circuit 740 may perform the second refresh operation to the weak word line corresponding to the weak row address WR_RADD when both of the second refresh signal REF2 and the matching signal MATCH are enabled.

Referring to FIG. 8B, as an example of the reference section information REF_SEC and the weak word line region information WEAK_SEC having the combination (00, 10), when a third refresh command REF is provided, the word line WL2 may be subject to the first refresh operation because the counting address CNT_RADD is 2, and the weak word line WL512 may be subject to the second refresh operation because the weak row address WR_RADD is 512 stored in the nonvolatile memory cell F2.

As an example of the reference section information REF_SEC and the weak word line region information WEAK_SEC having the combination (01, 11), when a (260)-th refresh command REF is provided, the word line WL259 may be subject to the first refresh operation because the counting address CNT_RADD is 259, and the weak word line WL768 may be subject to the second refresh operation because the weak row address WR_RADD is 768 stored in the nonvolatile memory cell F3.

As an example of the reference section information REF_SEC and the weak word line region information WEAK_SEC having the combination (10, 00), when a (513)-th refresh command REF is provided, the word line WL512 may be subject to the first refresh operation because the counting address CNT_RADD is 512, and the weak word line WL0 may be subject to the second refresh operation because the weak row address WR_RADD is 0 stored in the nonvolatile memory cell F0.

As an example case of the reference section information REF_SEC and the weak word line region information WEAK_SEC having the combination (11, 01), when a (770)-th refresh command REF is provided, the word line WL769 may be subject to the first refresh operation because the counting address CNT_RADD is 769, and the weak word line WL256 may be subject to the second refresh operation because the weak row address WR_RADD is 256 stored in the nonvolatile memory cell F1.

The memory device described with reference to FIGS. 6A, 6B, 7, 8A, and 8B may prevent the data of a weak word line from being deteriorated by storing a corresponding weak row address WR_RADD in a nonvolatile memory unit and performing a second refresh operation to the weak word line using the stored weak row address WR_RADD. Furthermore, the memory device may effectively prevent the data of the weak word line from being deteriorated by properly setting the interval in which the weak word line is subject to the first and second refresh operations.

Figure 9:
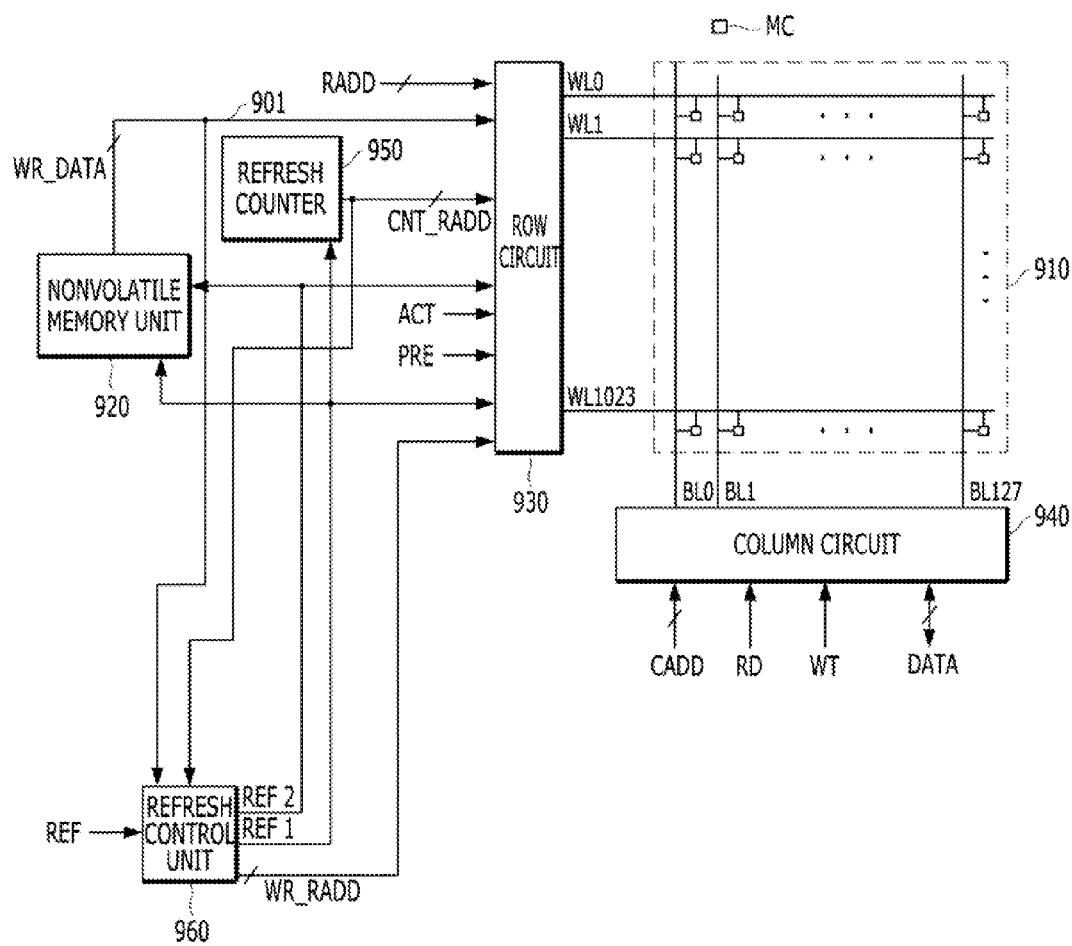
FIG. 9 is a diagram of a memory device, according to an embodiment of the present invention.

Referring to FIG. 9, a memory device, according to another embodiment of the invention, may include a cell array 910, a nonvolatile memory unit 920, a row circuit 930, a column circuit 940, a refresh counter 950, and a refresh control unit 960. The cell array 910, the row circuit 930, the column circuit 940, and the refresh counter 950 may be the same as the cell array 310, the row circuit 330, the column circuit 340, and the refresh counter 350 described with reference to FIG. 3. The data of the nonvolatile memory unit 920 may be transmitted through a transmission bus 901.

The nonvolatile memory unit 920 may provide the row circuit 930 with weak data WEAK_DATA of 1 bit stored therein whenever the second refresh signal REF2 is enabled. Even though the second refresh signal REF2 is enabled, the row circuit 930 may not perform the second refresh operation to a word line corresponding to the weak row address WR_RADD when the weak data WEAK_DATA is first data (e.g., 0) indicating that the word line corresponding to the weak row address WR_RADD is not the weak word line. The row circuit 930 may perform a second refresh operation to the word line corresponding to the weak row address WR_RADD when the second refresh signal REF2 is enabled and the weak data WEAK_DATA is second data (e.g., 1) indicating that the word line corresponding to the weak row address WR_RADD is the weak word line.

When the weak data WEAK_DATA is the second data, the refresh control unit 960 may generate the weak row address WR_RADD by inverting a specific bit (e.g., the most significant bit) of the counting address CNT_RADD. For example, when the counting address CNT_RADD is 0010010101 and the weak data WEAK_DATA is 1, the refresh control unit 960 may generate the weak data WR_RADD, for example, 1010010101.

Hereinafter, the refresh operation of a memory device is described with an example wherein a second refresh signal REF2 is enabled each time a refresh signal REF is enabled. The nonvolatile memory unit 920 of FIG. 9 may include a cell array 420_0 of 32 rows and columns.

Figure 10A:
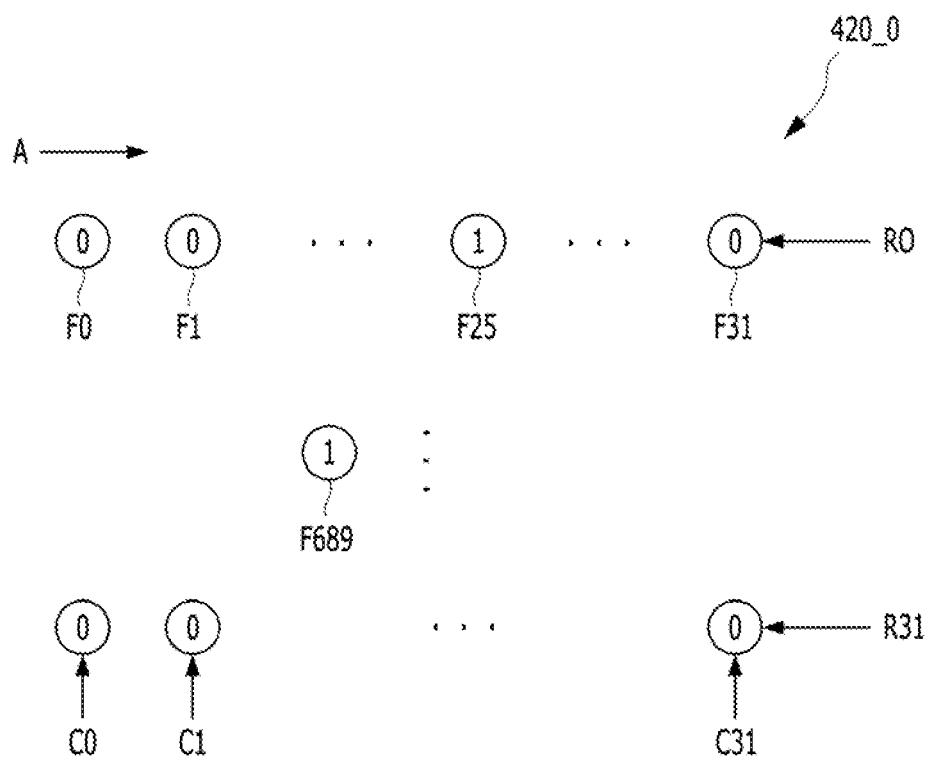
FIGS. 10A to 10C are diagrams illustrating an example operation of the memory device of FIG. 9, according to an embodiment of the invention.
Figure 10B:
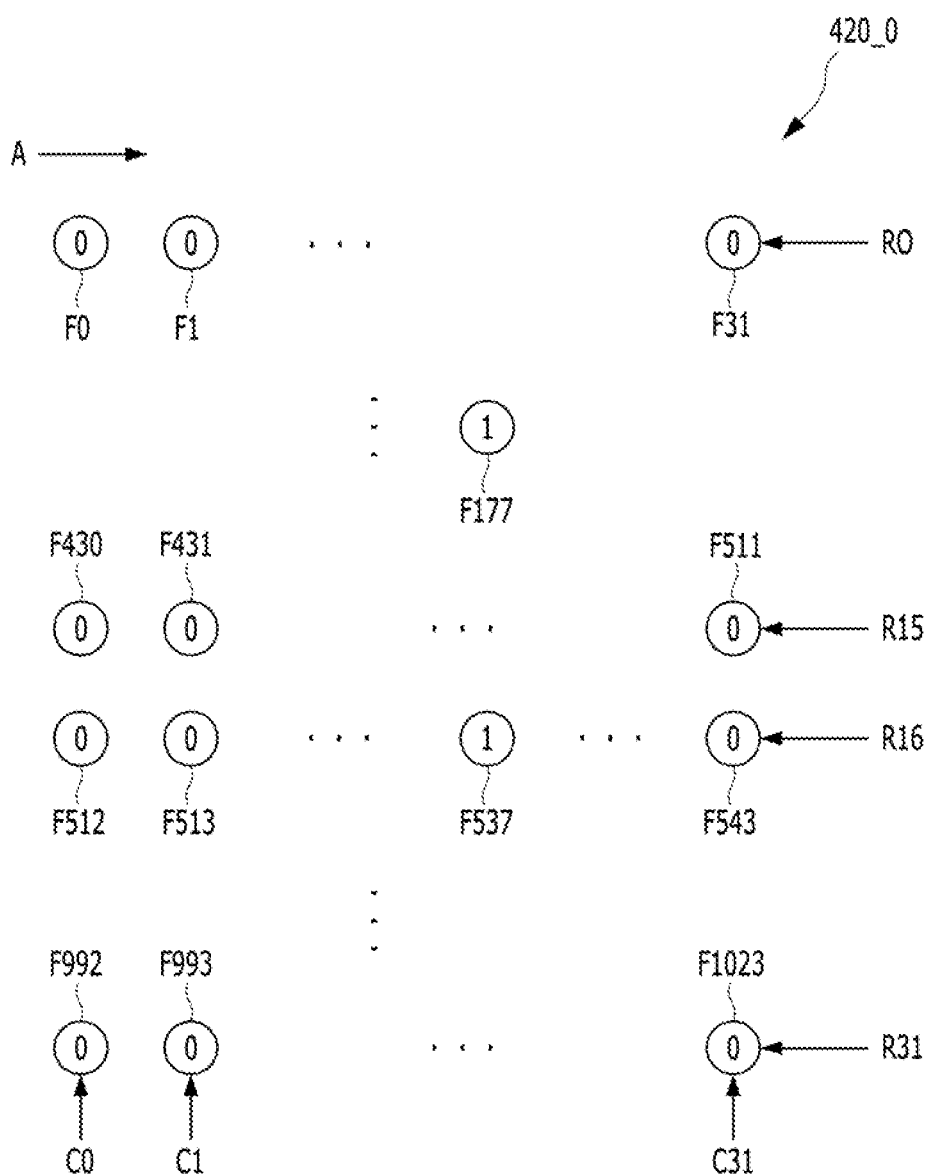
Figure 10C:
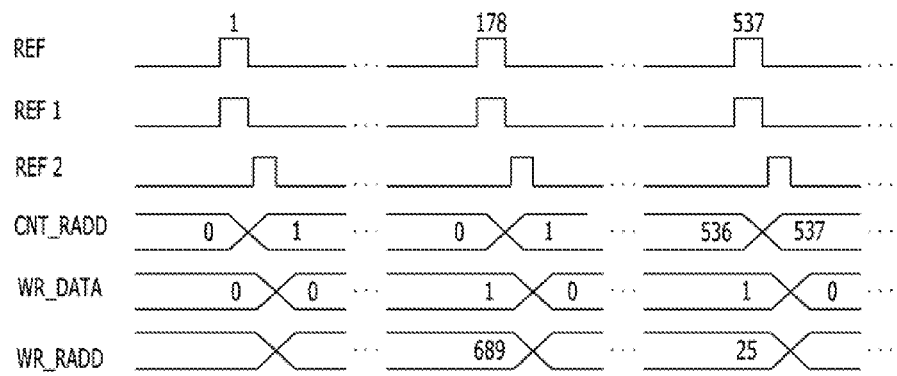

FIGS. 10A to 10C are diagrams illustrating an example operation of the memory device of FIG. 9.

The memory device, according to an embodiment, may store weak data WEAK_DATA indicating whether a corresponding word line WL0 to WL1023 is a weak word line, and perform a second refresh operation according to the weak data WEAK_DATA.

FIG. 10A shows that the weak data WEAK_DATA for the word lines WL0 to WL1023 are sequentially stored in the nonvolatile memory cells F0 to F1023, respectively.

Referring to the example of FIG. 10A, the nonvolatile memory unit 920 may sequentially output the weak data WEAK_DATA for each word line WL0 to WL1023 in order of the nonvolatile memory cells F512 to F1023 and then the nonvolatile memory cells F0 to F511 each time the second refresh signal REF2 is enabled. For example, the interval between the first and second refresh operations to the weak word line may be one half (½) of the refresh section tRFC. To this end, the nonvolatile memory unit 920 may sequentially output the weak data WEAK_DATA from a $16^{th}$ row R16 to a $31^{st}$ row R31, and then from a $0^{th}$ row to a $15^{th}$ row R15 of the cell array 420_0. As the second refresh signal REF2 is enabled plural times, the control unit 410 may control the peripheral circuit to select the nonvolatile memory cells F0 to F1024 in a preset sequential order indicated by arrow A in each row.

FIG. 10B shows that the weak data WEAK_DATA for the word lines WL0 to WL511 may be sequentially stored in the nonvolatile memory cells F512 to F1023 and the weak data WEAK_DATA for the word lines WL512 to WL1023 may be sequentially stored in the nonvolatile memory cells F0 to F511, respectively.

Referring to the example of FIG. 10B, the nonvolatile memory unit 920 may sequentially output the weak data WEAK_DATA for each word line WL0 to WL1023 in order of the nonvolatile memory cells F0 to F1023 each time the second refresh signal REF2 is enabled. For example, the interval between the first and second refresh operations to the weak word line may be ½ of the refresh section tRFC. To this end, the nonvolatile memory unit 920 may sequentially output the weak data WEAK_DATA from a $0^{th}$ row to a $31^{st}$ row R31 of the cell array 420_0. As the second refresh signal REF2 is enabled plural times, the control unit 410 may control the peripheral circuit to select the nonvolatile memory cells F0 to F1024 in a preset sequential order as indicated by arrow A in each row.

In both of the examples shown in FIGS. 10A and 10B, the nonvolatile memory unit 320 may provide the row circuit 730 and the refresh control unit 760 with the weak data WEAK_DATA for the word lines WL512 to WL1023 and then the word lines WL0 to WL511 in order.

It is assumed that the weak word lines are the word lines WL25 and WL689, and thus the nonvolatile memory cells F537 and F177 have the value of 1, respectively.

Referring to FIG. 10C, when a (178)-th refresh command REF is provided, the word line WL177 may be subject to the first refresh operation because the counting address CNT_RADD is 177 corresponding to the binary value 0010110001. Therefore, since the value of weak data WEAK_DATA stored in the nonvolatile memory cell F177 is 1, the refresh control unit 760 may generate the weak row address 689 corresponding to the binary value 1010110001, which is generated by inverting the most significant bit of the binary value 0010110001 (i.e., the counting address 177). Accordingly, the weak word line WL689 may be subject to a second refresh operation.

Also referring to FIG. 10C, when a (538)-th refresh command REF is provided, the word line WL537 may be subject to the first refresh operation because the counting address CNT_RADD is 537 corresponding to the binary value 1000011001. Therefore, since the value of transmitted weak data WEAK_DATA stored in the nonvolatile memory cell F537 is 1, the refresh control unit 760 may generate the weak row address 25 corresponding to the binary value 0000011001, which is generated by inverting the most significant bit of 1000011001 (i.e., the counting address 537). Accordingly, the weak word line WL25 may be subject to a second refresh operation.

The memory device described with reference to FIGS. 9 and 10A to 10C may prevent the data of the weak word line from being deteriorated by storing weak data WEAK_DATA for each word line in the nonvolatile memory unit and performing a second refresh operation to the weak word line according to the stored weak data WEAK_DATA. Furthermore, the number of nonvolatile memory cells necessary to refresh the weak word line may be reduced because data of only 1 bit are stored in order to determine whether each word line is the weak word line.

For example, the memory device described with reference to FIGS. 3 to 10C may directly send data stored in the nonvolatile memory unit to the row circuit for the second refresh operation, however the invention may not be limited in this way.

Figure 11:
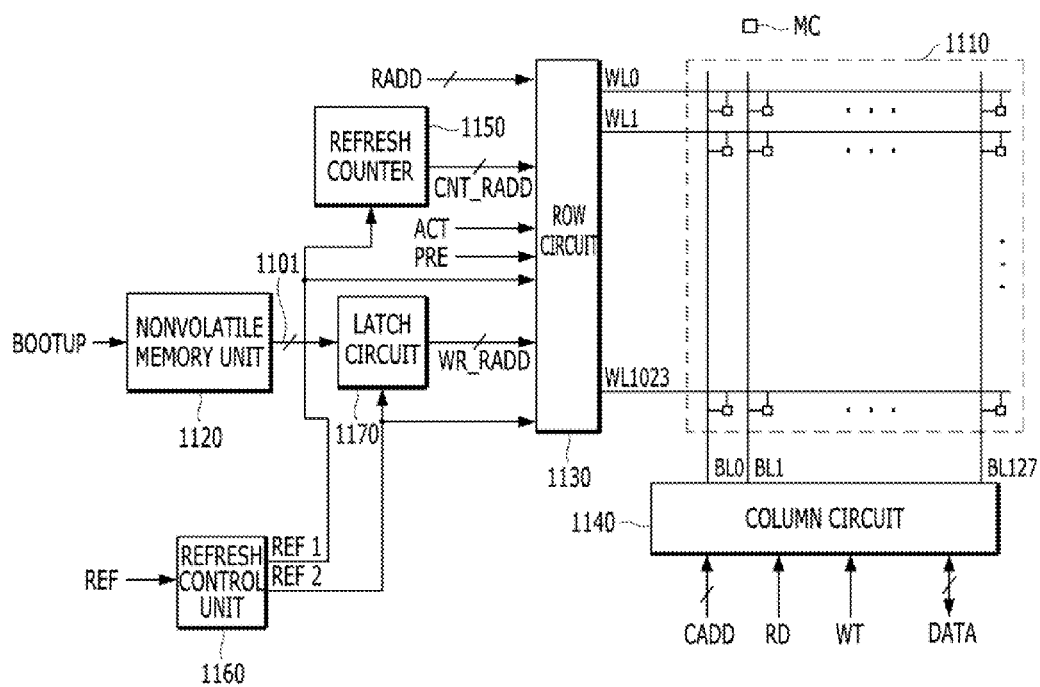
FIG. 11 is a diagram of a memory device, according to an embodiment of the invention.

FIG. 11 is a simplified diagram of a memory device according to another embodiment of the present invention. Referring to FIG. 11, the memory device may include a cell array 1110, a nonvolatile memory unit 1120, a row circuit 1130, a column circuit 1140, a refresh counter 1150, a refresh control unit 1160, and a latch circuit 1170. The cell array 1110, the row circuit 1130, the column circuit 1140, and the refresh counter 1150 may be the same as the cell array 310, the row circuit 330, the column circuit 340, and the refresh counter 350 described with reference to FIG. 3, therefore detailed description thereof will not be repeated.

When a boot-up signal BOOTUP is enabled, the nonvolatile memory unit 1120 may sequentially send stored data (i.e.

the weak row addresses WR_RADD) to the latch circuit 1170 through a transmission bus 1101. The latch circuit 1170 may include a plurality of latches and sequentially latch the weak row addresses WR_RADD transmitted from the nonvolatile memory unit 1120 through the transmission bus 1101. The number of latches included in the latch circuit 1170 may be the same as that of nonvolatile memory cells included in the nonvolatile memory unit 1120. Accordingly, the data of each of the nonvolatile memory cells included in the nonvolatile memory unit 1120 may be stored through corresponding latch. That is, the data of the nonvolatile memory unit 1120 may be mapped to the latch circuit 1170 in a one-to-one manner.

When a second refresh signal REF2 is enabled, the latch circuit 1170 may send stored weak row addresses WR_RADD to the row circuit 1130. When the number of stored weak row addresses WR_RADD is 2 or more, the latch circuit 1170 may sequentially send the weak row addresses WR_RADD.

The memory device of FIG. 11 may perform a second refresh operation in the same manner as the memory device of FIGS. 5A and 5B. That is, when a particular weak row address WR_RADD is latched in each of K latches in the latch circuit 1170, the weak word line corresponding to the particular weak row address WR_RADD may be subject to K numbers of the second refresh operations during the refresh section tRFC.

Furthermore, the memory device of FIG. 11 may perform a second refresh operation in the same manner as the memory device described with reference to FIGS. 6A and 6B. That is, the interval between the first and second refresh operations to the weak word line may be properly set by dividing the latches of the latch circuit 1170 into plural (e.g., four) groups of the latches respectively corresponding to the first to fourth sections of the refresh section tRFC and latching the weak row addresses in corresponding group of the latches.

Figure 12:
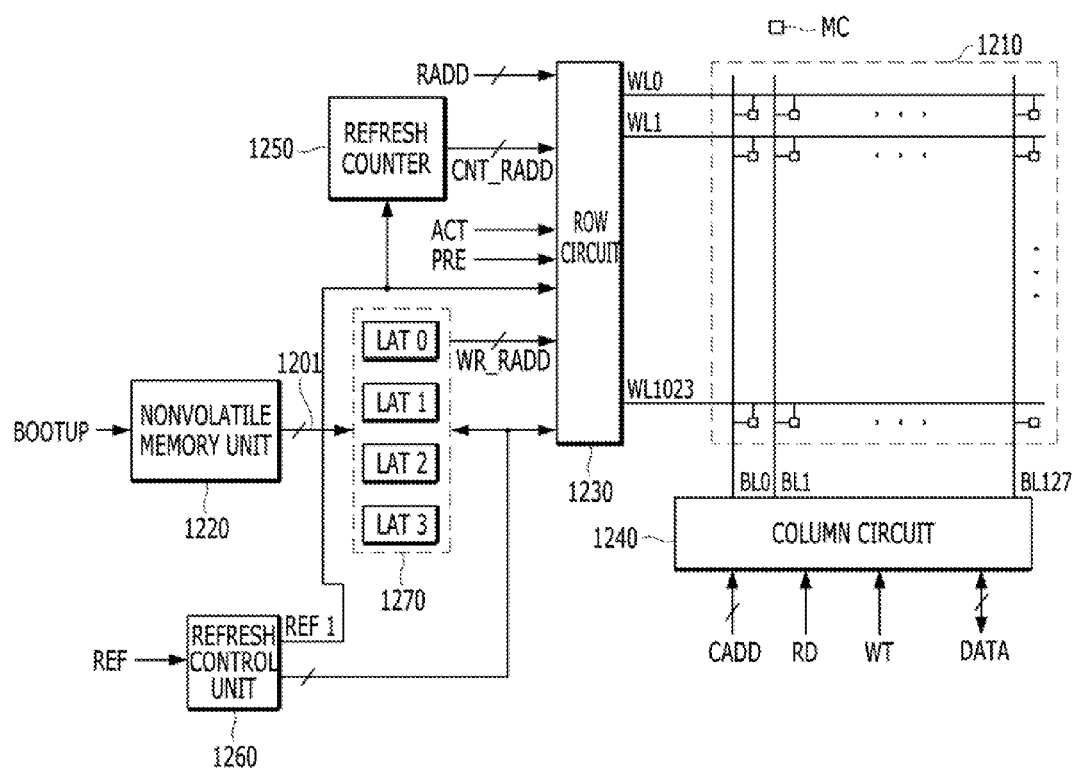
FIG. 12 is a diagram of a memory device, according to an embodiment of the invention.

FIG. 12 is a simplified diagram of a memory device according to yet another embodiment of the invention.

Referring to FIG. 12, the memory device may include a cell array 1210, a nonvolatile memory unit 1220, a row circuit 1230, a column circuit 1240, a refresh counter 1250, a refresh control unit 1260, and a latch circuit 1270. The data of the nonvolatile memory unit 1220 may be transmitted through a transmission bus 1201. The memory device of FIG. 12 may be the same as the memory device of FIG. 11 except for the nonvolatile memory unit 1220 and the latch circuit 1270.

The latch circuit 1270 may include a plurality of latch units LAT0 to LAT3. Each of the plurality of latch units LAT0 to LAT3 may store a plurality of weak row addresses WR_RADD. Each of the cell arrays 420_0 to 420_9 of the nonvolatile memory unit 1220 may be divided into a plurality of regions S0 to S3 respectively corresponding to the plurality of latch units LAT0 to LAT3.

Figure 13:
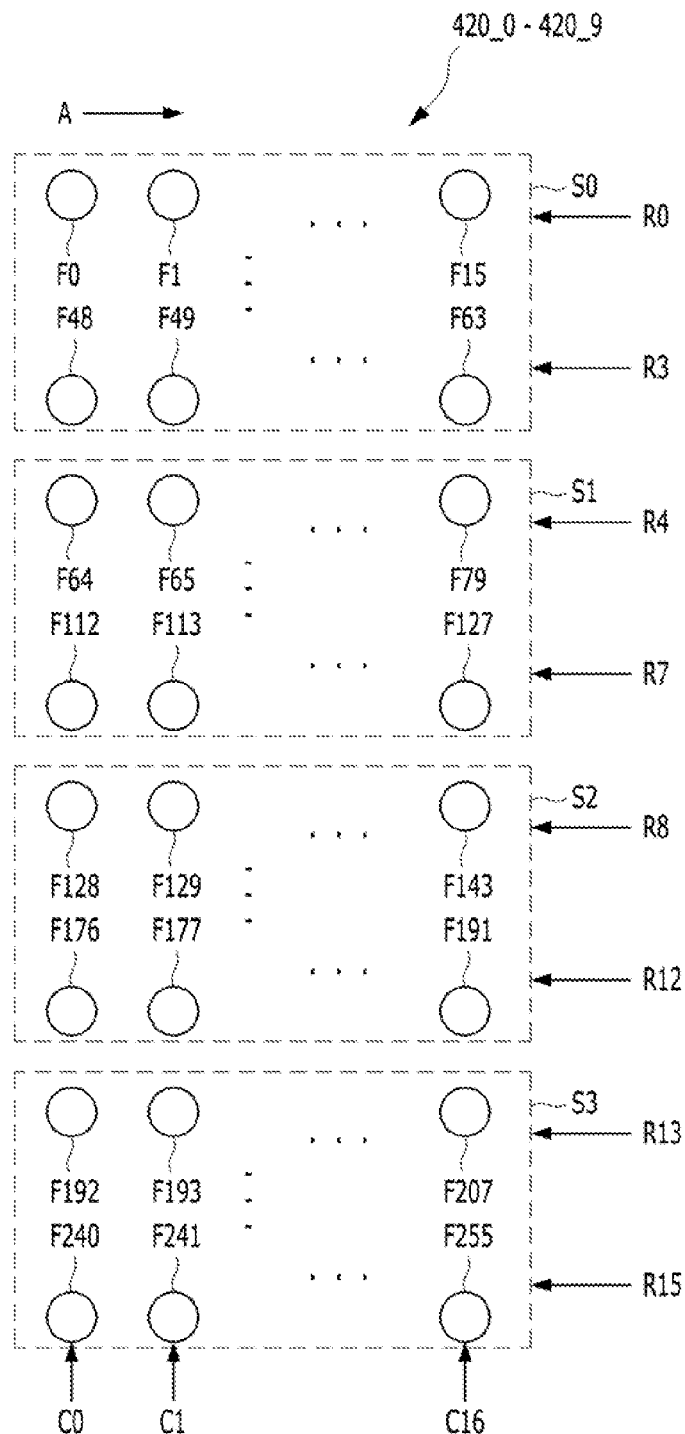
FIG. 13 is a diagram illustrating an example operation of the memory device of FIG. 12, according to an embodiment of the invention.

Referring now to FIG. 13, another example of an operation of a memory device is provided wherein each of the cell arrays 420_0 to 420_9 may be divided into the respective regions S0 to S3. The region S0 may be a region in which weak row addresses WR_RADD subject to the second refresh operation once during the refresh section tRFC are stored. The region S1 may be a region in which weak row addresses WR_RADD subject to the second refresh operation twice during the refresh section tRFC are stored. The region S2 may be a region in which weak row addresses WR_RADD subject to the second refresh operation three times during the refresh section tRFC are stored. The region S3 may be a region in which weak row addresses WR_RADD subject to the second refresh operation four times during the refresh section tRFC are stored.

When a boot-up operation is performed, a weak row address WR_RADD stored in the region S0 may be transmitted to the latch unit LAT0 and stored therein, a weak row address WR_RADD stored in the region S1 may be transmitted to the latch unit LAT1 and stored therein, a weak row address WR_RADD stored in the region S2 may be transmitted to the latch unit LAT2 and stored therein, and a weak row address WR_RADD stored in the region S4 may be transmitted to the latch unit LAT4 and stored therein.

The refresh control unit 1260 may control the latch circuit 1270 and the row circuit 1230 so that the weak word line corresponding to a weak row address WR_RADD latched in the latch unit LAT0 may be refreshed once during the refresh section tRFC, the weak word line corresponding to a weak row address WR_RADD latched in the latch unit LAT1 may be refreshed twice during the refresh section tRFC, the weak word line corresponding to a weak row address WR_RADD latched in the latch unit LAT2 may be refreshed three times during the refresh section tRFC, and the weak word line corresponding to a weak row address WR_RADD latched in the latch unit LAT3 may be refreshed four times during the refresh section tRFC.

Figure 14:
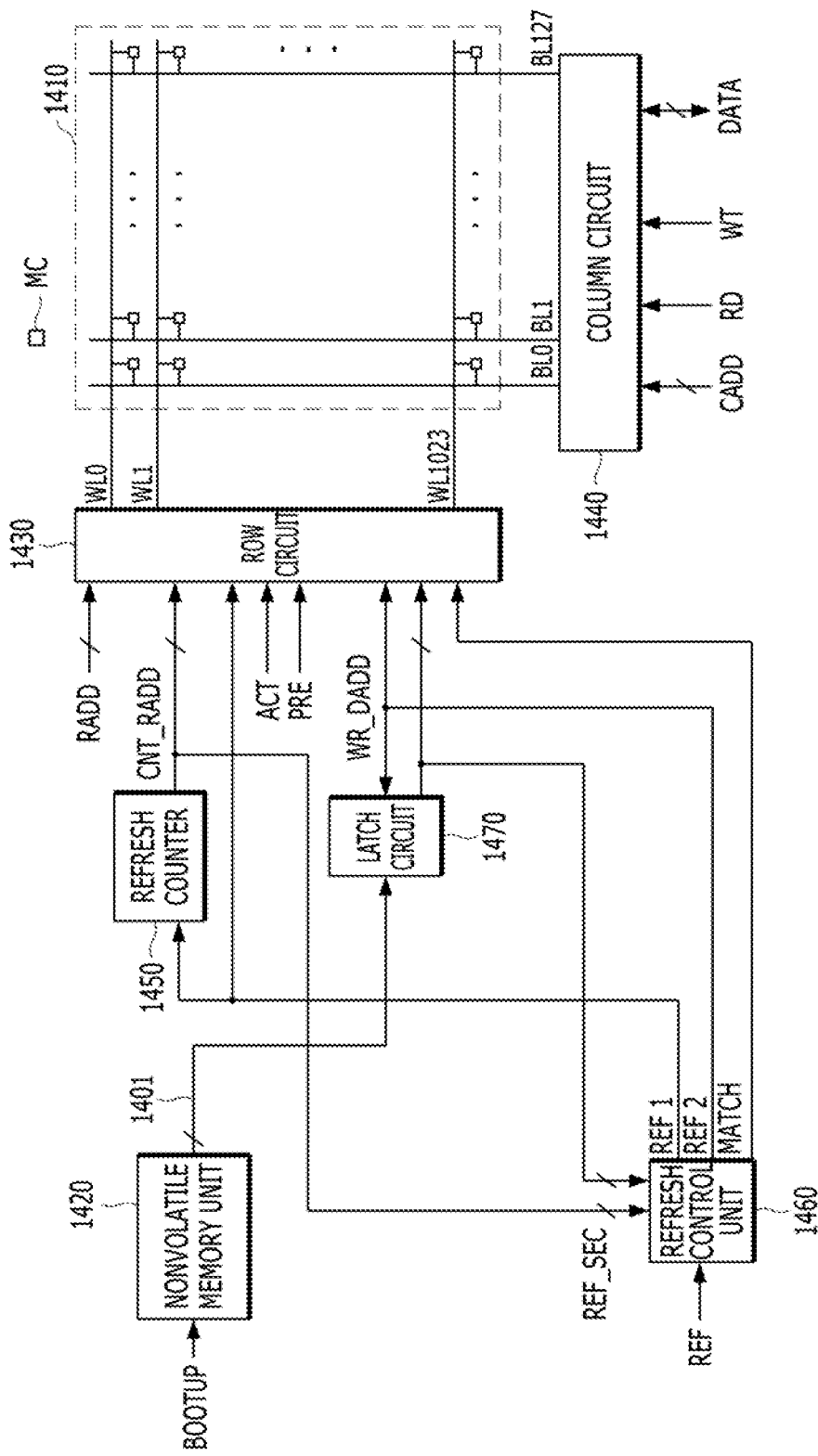
FIG. 14 is a diagram of a memory device, according to embodiment of the invention.

Referring now to FIG. 14, another example of a memory device may include a cell array 1410, a nonvolatile memory unit 1420, a row circuit 1430, a column circuit 1440, a refresh counter 1450, a refresh control unit 1460, and a latch circuit 1470. The data of the nonvolatile memory unit 1420 may be transmitted through a transmission bus 1401.

The memory device of FIG. 14 may perform the second refresh operation in the same manner as the memory device of FIGS. 8A and 8B. That is, the interval between the first and second refresh operations to the weak word line may be properly set through control of the refresh control unit 1460.

Figure 15:
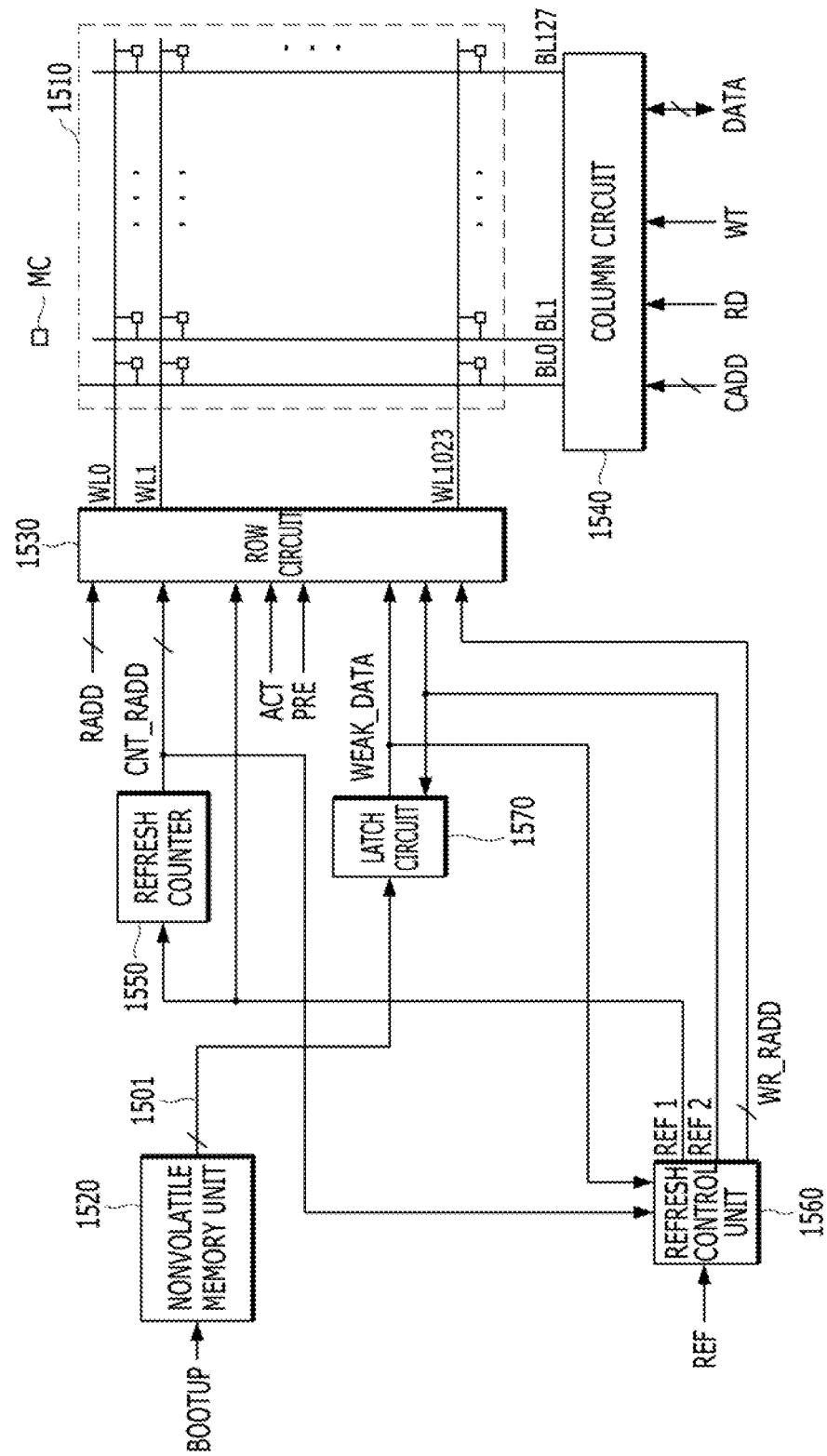
FIG. 15 is a diagram of a memory device, according to an embodiment of the invention.

Referring now to FIG. 15, another example of a memory device may include a cell array 1510, a nonvolatile memory unit 1520, a row circuit 1530, a column circuit 1540, a refresh counter 1550, a refresh control unit 1560, and a latch circuit 1570. The data of the nonvolatile memory unit 1520 may be transmitted through a transmission bus 1501.

The memory device of FIG. 15 may perform a second refresh operation in the same manner as the memory device of FIGS. 10A, 10B, and 10C. That is, weak data WEAK_DATA for each of word lines stored in the nonvolatile memory unit 1520 may be stored in a latch corresponding to each of word lines included in the latch circuit 1570, and the second refresh operation may be performed on the weak word line according to weak data WEAK_DATA.

According to the invention, a memory device and a method operation thereof are provided wherein weak memory cells having a data retention time less than a reference time may retain their data and operate normally.

Although various embodiments have been described for illustrative purposes, it will be apparent to those skilled in the art that various changes and modifications may be made without departing from the spirit and scope of the invention as defined in the following claims.

What is claimed is:

1. A memory device, comprising:
   a plurality of word lines each word line being operably coupled to one or more memory cells;
   a peripheral circuit suitable for performing first and second refresh operations to the plurality of word lines;
   wherein the first refresh operation is suitable for preserving stored data for a majority of the memory cells of the memory device and the second refresh operation is suitable for preserving stored data of one or more weak memory cells.

2. The memory device of claim 1, further comprising:
a nonvolatile memory unit suitable for storing weak row addresses of one or more weak word lines among the plurality of word lines; and
a refresh control unit suitable for controlling the peripheral circuit to sequentially perform the first refresh operation to the plurality of word lines during a refresh section, and to perform the second refresh operation to the weak word lines during the refresh section based on the weak row addresses.

3. The memory device of claim 1,
wherein the nonvolatile memory unit stores a single number or plural numbers of each of the weak row addresses, and
wherein the refresh control unit controls the peripheral circuit to perform the second refresh operation to each of the weak word lines as many times as the single number or the plural numbers of corresponding weak row address stored in the nonvolatile memory unit during the refresh section.

4. The memory device of claim 1,
wherein the nonvolatile memory unit is divided into a plurality of regions, and
wherein the refresh control unit controls the peripheral circuit to perform the second refresh operation to each of the weak word lines K number of times according to corresponding weak row address stored in a K-th region of the nonvolatile memory unit during the refresh section.

5. The memory device of claim 1,
further comprising a refresh counter suitable for generating a counting address,
wherein the refresh control unit controls the peripheral circuit to perform the first refresh operation to the plurality of word lines according to the counting address whenever a refresh command is provided, and
wherein the refresh control unit controls the peripheral circuit to perform the second refresh operation to the weak word lines whenever the refresh command is provided a preset number of times.

6. The memory device of claim 1,
further comprising one or more latch units suitable for latching the weak row addresses,
wherein the refresh control unit controls the peripheral circuit to perform the second refresh operation to the weak word lines based on the latched weak row addresses.

7. The memory device of claim 1, wherein:
the nonvolatile memory unit sequentially sends the one or more addresses to the refresh control unit whenever the refresh command is provided a preset number of times, and
the refresh control unit controls the peripheral circuit to sequentially perform the second refresh operation to the weak word lines one by one whenever the refresh command is provided a preset number of times during the refresh section.

8. The memory device of claim 1,
wherein the nonvolatile memory unit comprises a plurality of fuse cells suitable for storing data of 1 bit, and
wherein the plurality of fuse cells is disposed in an array form.

9. A memory device, comprising:
a plurality of word lines coupled to one or more memory cells;
a peripheral circuit suitable for performing first and second refresh operations to the plurality of word lines;
a nonvolatile memory unit suitable for storing weak row addresses of one or more weak word lines among the plurality of word lines; and
a refresh control unit suitable for controlling the peripheral circuit to perform the first refresh operation to the plurality of word lines once during a refresh section divided into N numbers (N is a natural number more than two) of sub-refresh sections, and to perform the second refresh operation to the weak word lines during the refresh section,
wherein the refresh control unit controls the peripheral circuit to perform the first and second refresh operations to each of the weak word lines at an interval of one or more of the N numbers of sub-refresh sections.

10. The memory device of claim 9,
wherein the refresh control unit controls the peripheral circuit to perform the second refresh operation to the weak word lines during a (K+N/2)-th sub-refresh section when the refresh control unit controls the peripheral circuit to perform the first refresh operation to the weak word lines during a K-th sub-refresh section (K is a natural number less than N/2), and
wherein the refresh control unit controls the peripheral circuit to perform the second refresh operation to the weak word lines during a (L−N/2)-th sub-refresh section when the refresh control unit controls the peripheral circuit to perform the first refresh operation to the weak word lines during a L-th sub-refresh section (L is a natural number more than N/2 and less than N).

11. The memory device of claim 9,
further comprising a refresh counter suitable for generating a counting address,
wherein the refresh control unit controls the peripheral circuit to perform the first refresh operation to the plurality of word lines according to the counting address whenever a refresh command is provided, and
wherein the refresh control unit controls the peripheral circuit to perform the second refresh operation to each of the weak word lines based on the weak row addresses, a preset part of which forms a preset pattern with corresponding part of the counting address, whenever the refresh command is provided a preset number of times.

12. The memory device of claim 11,
wherein the refresh control unit may control the peripheral circuit to perform the second refresh operation to each of the weak word lines during a K-th sub-refresh section (K is a natural number less than N/2) when the preset part of the counting address represents to a (K+N/2)-th sub-refresh section and the preset part of corresponding weak row address represents the K-th sub-refresh section, and
wherein the refresh control unit controls the peripheral circuit to perform the second refresh operation to each of the weak word lines during an L-th sub-refresh section (L is a natural number more than N/2 and less than N) when the preset part of the counting address represent an (L−N/2)-th sub-refresh section and the preset part of corresponding weak row address represents the L-th sub-refresh section.

13. The memory device of claim 9,
wherein the nonvolatile memory unit is divided into N numbers of regions respectively corresponding to the N numbers of sub-refresh sections, and
wherein the nonvolatile memory unit stores the weak row addresses in the N numbers of regions such that one of the weak row addresses corresponding to one of the weak word lines subject to the first refresh operation during a particular one of the N numbers of sub-refresh sections is stored in different region from one corresponding to the particular sub-refresh section.

14. The memory device of claim 9,
wherein the nonvolatile memory unit is divided into N numbers of regions respectively corresponding to the N numbers of sub-refresh sections,
wherein a K-th region among the N numbers of regions (K is a natural number less than N/2) stores the weak row addresses of the weak word lines subject to the first refresh operation during a (K+N/2)-th sub-refresh section,
wherein the L-th region among the N numbers of regions (L is a natural number of more than N/2 and less than N) stores the weak row addresses of the weak word lines subject to the first refresh operation during an (L−N/2)-th sub-refresh section, and
the refresh control unit controls the peripheral circuit to perform the second refresh operation to the weak word lines in sequence of the N numbers of regions during the N numbers of sub-refresh sections in sequence.

15. The memory device of claim 9,
further comprising one or more latch units suitable for latching the weak row addresses,
wherein the refresh control unit controls the peripheral circuit to perform the second refresh operation to the weak word lines based on the latched weak row addresses.

16. The memory device of claim 9, wherein:
the nonvolatile memory unit sequentially sends the one or more addresses to the refresh control unit whenever the refresh command is provided a preset number of times, and
the refresh control unit controls the peripheral circuit to sequentially perform the second refresh operation to the weak word lines one by one whenever the refresh command is provided a preset number of times during the refresh section.

17. The memory device of claim 9,
wherein the nonvolatile memory unit comprises a plurality of fuse cells suitable for storing data of 1 bit, and
wherein the plurality of fuse cells is disposed in an array form.

18. A memory device, comprising:
first to N-th word lines coupled to one or more memory cells;
a peripheral circuit suitable for performing first and second refresh operations to the plurality of word lines;
a nonvolatile memory unit comprising first to N-th nonvolatile memory cells suitable for storing first to N-th weak data, which correspond to the respective first to N-th word lines and each of which stores one of first and second values; and
a refresh control unit suitable for controlling the peripheral circuit to sequentially perform the first refresh operation to the plurality of word lines during a refresh section, and to perform the second refresh operation to weak word lines during the refresh section based on the first to N-th weak data.

19. The memory device of claim 18,
wherein the first to N-th nonvolatile memory cells sequentially correspond to the respective first to N-th word lines, and
wherein the refresh control unit controls the peripheral circuit to perform the second refresh operation to the weak word lines by referring to the first to N-th nonvolatile memory cells in a first sequence of order.

20. The memory device of claim 18,
wherein the first to N-th nonvolatile memory cells correspond to the respective first to N-th word lines in a second sequence of order, and
wherein the refresh control unit controls the peripheral circuit to perform the second refresh operation to the weak word lines by sequentially referring to the first to N-th nonvolatile memory cells.

21. The memory device of claim 18,
further comprising a refresh counter suitable for generating a counting address,
wherein the refresh control unit controls the peripheral circuit to sequentially perform the first refresh operation to the plurality of word lines according to the counting address whenever a refresh command is provided, and
wherein the refresh control unit controls the peripheral circuit to perform the second refresh operation to the weak word lines based on weak row addresses, which are generated by inverting a preset part of the counting address according to the first value of the first to N-th of weak data, whenever a refresh command is provided.

22. The memory device of claim 18,
further comprising first to N-th latches suitable for sequentially latching the respective first to N-th weak data,
wherein the refresh control unit controls the peripheral circuit to sequentially perform the first refresh operation to the plurality of word lines according to a counting address whenever a refresh command is provided, and
wherein the refresh control unit controls the peripheral circuit to perform the second refresh operation to the weak word lines based on weak row addresses, which are generated by inverting a preset part of the counting address according to the first value of the latched first to N-th of weak data, whenever a refresh command is provided.

23. The memory device of claim 18,
wherein the nonvolatile memory unit comprises a plurality of fuse cells suitable for storing data of 1 bit, and
wherein the plurality of fuse cells is disposed in an array form.

24. The memory device of claim 19, wherein the refresh control unit refers to a half of the first to N-th weak data for a second half of the first to N-th word lines stored in the second half of the first to N-th nonvolatile memory cells and then refers to the other half of the first to N-th weak data for a first half of the first to N-th word lines stored in the first half of the first to N-th nonvolatile memory cells.

25. The memory device of claim 20, wherein a half of the first to N-th weak data for a first half of the first to N-th word lines are stored in a second half of the first to N-th nonvolatile memory cells and the other half of the first to N-th weak data for a second half of the first to N-th word lines are stored in a first half of the first to N-th nonvolatile memory cells.

* * * * *